(12) United States Patent
Koo et al.

(10) Patent No.: US 12,433,005 B2
(45) Date of Patent: Sep. 30, 2025

(54) RF SWITCH DEVICE

(71) Applicant: DB HiTek Co., Ltd., Bucheon-si (KR)

(72) Inventors: Ja Geon Koo, Eumseong-gun (KR);
Jin Hyo Jung, Suwon-si (KR); Hae Taek Kim, Bucheon-si (KR); Hyun Joong Lee, Daejeon (KR); Jung Ah Kim, Dongducheon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 437 days.

(21) Appl. No.: 18/171,657

(22) Filed: Feb. 20, 2023

(65) Prior Publication Data
US 2023/0335611 A1   Oct. 19, 2023

(30) Foreign Application Priority Data

Apr. 18, 2022   (KR) .................... 10-2022-0047299

(51) Int. Cl.
*H10D 64/27* (2025.01)
*H10D 8/00* (2025.01)
*H10D 84/80* (2025.01)

(52) U.S. Cl.
CPC ............. *H10D 64/519* (2025.01); *H10D 8/00* (2025.01); *H10D 84/811* (2025.01)

(58) Field of Classification Search
CPC ...... H10D 64/519; H10D 64/111; H10D 8/00; H10D 84/811; H10D 84/85; H10D 30/6744; H10D 30/023; H10D 30/611; H10D 86/201; H03K 17/6871
See application file for complete search history.

(56) References Cited

U.S. PATENT DOCUMENTS

| | | |
|---|---|---|
| 11,362,655 B2 | 6/2022 | Koo et al. |
| 2020/0395383 A1* | 12/2020 | Willard ................. H01L 23/02 |
| 2021/0281260 A1 | 9/2021 | Koo et al. |
| 2023/0092546 A1* | 3/2023 | Vedula ............... H01L 23/4824 |
| | | 257/347 |

FOREIGN PATENT DOCUMENTS

KR   10-2021-0111982 A   9/2021

OTHER PUBLICATIONS

E. F. Tsakas and A. N. Birbas, "Noise associated with interdigitated gate structures in RF submicron MOSFETs," in IEEE Transactions on Electron Devices, vol. 47, No. 9, pp. 1745-1750, Sep. 2000, doi: 10.1109/16.861586 (Year: 2000).*

* cited by examiner

*Primary Examiner* — Sitaramarao S Yechuri
(74) *Attorney, Agent, or Firm* — Central California IP Group, P.C.; Andrew D. Fortney (57) ABSTRACT

Provided is an RF switch device and a method of manufacturing the same and, more particularly, to an RF switch device that improves the on-resistance (Ron) of the RF switch by including an integral or integrally formed P diode. The RF switch device includes a first active region on a first substrate as a first base, a second active region on the first substrate spaced apart from the first active region as a second base, and a gate electrode on the first active region and on the second active region.

17 Claims, 4 Drawing Sheets

RF SWITCH DEVICE

CROSS REFERENCE TO RELATED APPLICATION

The present application claims priority to Korean Patent Application No. 10-2022-0047299, filed Apr. 18, 2022, the entire contents of which are incorporated herein for all purposes by this reference.

BACKGROUND OF THE INVENTION

Field of the Invention

The present disclosure relates to an RF switch device and a method of manufacturing the same and, more particularly, to an RF switch device that improves an on-resistance (Ron) characteristic by including an integral or integrally formed P diode. The RF switch device includes a first active region on a first substrate as a first base, a second active region on the first substrate spaced apart from the first active region as a second base, and a gate electrode on the first active region and on the second active region.

Description of the Related Art

An RF switch device, which is sometimes an element in a communication system, may be mounted or included in a wireless communication system to perform transmission/reception discrimination, frequency band selection, etc.

The figure of merit (FoM=Ron*Coff) is an important performance indicator of RF switch devices. In order to improve the performance of an RF switch device, one may improve or increase on-resistance (Ron), and methods to improve Ron include gate shrinking, implanting, and back-end (B/E) optimization. Ron may also be improved by connecting a P diode between a gate and a body of the RF switch, then utilizing a floating body effect when the RF switch is on or active.

With the gate shrink method, Ron may improve, but there is a problem in that the breakdown voltage of the RF switch decreases. As for Ron improvement using a P diode, although a negative bias is applied to the gate and body to utilize the floating body effect when the RF switch is on and a diode turn-on effect when the RF switch is off, the addition of the P diode is a disadvantage in terms of space efficiency.

Document of Related Art

Korean Patent Application Publication No. 10-2021-0111982

SUMMARY OF THE INVENTION

The present disclosure has been made to solve the problems of the related art, and an objective of the present disclosure is to provide an RF switch device that improves on-resistance (Ron) of the RF switch by including an integral or integrally formed P diode.

In addition, an objective of the present disclosure is to provide an RF switch device configured to control a body bias with a gate bias.

Furthermore, an objective of the present disclosure is to provide an RF switch device that removes body routes through self-body bias.

According to an embodiment of the present disclosure, there is provided an RF switch device, including a first active region on or in a first substrate as a first base; a second active region on or in the first substrate spaced apart from the first active region as a second base; and a gate electrode on the first active region and on the second active region.

According to another embodiment of the present disclosure, in the RF switch device, the gate electrode may include a first horizontal electrode on the first active region and the second active region along a first direction; a second horizontal electrode spaced apart from the first horizontal electrode and on the first active region and the second active region along the first direction; and one or more cross-electrodes on the first active region along a second direction perpendicular to the first direction, wherein each of the one or more cross-electrodes has ends respectively connected to the first horizontal electrode and the second horizontal electrode.

According to still another embodiment of the present disclosure, in the RF switch device, the one or more vertical cross-electrodes may include a first cross-electrode on the first active region along the second direction; a second cross-electrode spaced apart from the first cross-electrode, on the first active region along the second direction; and a third cross-electrode spaced apart from the second cross-electrode, on the first active region along the second direction, wherein the second cross-electrode may be between the first cross-electrode and the third cross-electrode.

According to still another embodiment of the present disclosure, in the RF switch device, the first active region may include a first source on a first side of the first cross-electrode (e.g., opposite from the second cross-electrode); a first drain between the first cross-electrode and the second cross-electrode; a second source between the second cross-electrode and the third cross-electrode; and a second drain on a remaining side of the third cross-electrode (e.g., opposite from the second cross-electrode).

According to still another embodiment of the present disclosure, in the RF switch device, the second active region may include a cathode between the first horizontal electrode and the second horizontal electrode; a first anode on a side of the first horizontal electrode opposite from the cathode; and a second anode on a side of the second horizontal electrode opposite from the cathode.

According to still another embodiment of the present disclosure, the RF switch device may further include a first conductive region adjacent to the first horizontal electrode, configured to connect the first active region and the second active region; and a second conductive region adjacent to the second horizontal electrode, configured to connect the first active region and the second active region.

According to still another embodiment of the present disclosure, there is provided an RF switch device, including a first active region on or in a first substrate as a first base, including a source and a drain; a second active region on or in the first substrate spaced apart from the first active region as a second base, including a first anode, a second anode, and a cathode therebetween; and a gate electrode on the first active region and on the second active region.

According to still another embodiment of the present disclosure, in the RF switch device, the gate electrode may include one or more cross-electrodes, and in the first active region, one of the cross-electrodes may be between the source and the drain.

According to still another embodiment of the present disclosure, in the RF switch device, the gate electrode may include first and second horizontal electrodes over the first active region and the second active region and spaced apart from each other, and the first anode, the second anode and the cathode may be between the first and second horizontal electrodes.

According to still another embodiment of the present disclosure, the RF switch device may further comprise a separator separating the first active region and the second active region, and a conductive region connecting at least a portion of the first active region and a portion of the second active region.

According to still another embodiment of the present disclosure, there is provided an RF switch device, including a first active region comprising a P well on or in a substrate; a P diode comprising an N well on or in the substrate; and a gate electrode on the first active region and the P diode, wherein the gate electrode may include first and second horizontal electrodes spaced apart from each other; and a plurality of cross-electrodes connecting the first and second horizontal electrodes, and the P diode may include a cathode between the first horizontal electrode and the second horizontal electrode; and a first anode and a second anode on opposite sides of the cathode.

According to still another embodiment of the present disclosure, in the RF switch device, the first active region may include a source on a first side of one of the cross-electrodes; and a drain on a second side of the one of the cross-electrodes.

According to still another embodiment of the present disclosure, the RF switch device may further include a first conductive region adjacent to one of the first and second horizontal electrodes and connecting the first active region and the P diode; and a second conductive region adjacent to a remaining one of the first and second horizontal electrodes and connecting the first active region and the P diode.

According to still another embodiment of the present disclosure, the RF switch device may further include a separator electrically separating the first active region and the P diode, and a conductive region (e.g., at least one of the first and second conductive regions) connecting at least a portion of the first active region and a portion of the P diode.

According to still another embodiment of the present disclosure, in the RF switch device, the first anode and the second anode may comprise first conductivity type impurity-doped regions.

According to still another embodiment of the present disclosure, the RF switch device may further include a body region under each of the horizontal electrodes in the first active region.

According to still another embodiment of the present disclosure, there is provided an RF switch device, including a first active region comprising a P well on or in a substrate; a second active region comprising an N well on or in the substrate; and a gate electrode on the first active region and the second active region, wherein the gate electrode may include first and second horizontal electrodes spaced apart from each other and a plurality of cross-electrodes connecting the first and second horizontal electrodes; the first active region may include one or more source and drain terminals spaced apart from each other, and a body region under each of the first and second horizontal electrodes in the first active region; and the second active region may include a cathode between the first and second horizontal electrodes; and a first anode and a second anode on opposite sides of the cathode.

The present disclosure has the following effects by the above configurations.

In the case of a typical RF switch, when an RF signal passes a drain and a source during operation of the RF switch, it is an AC signal rather than a DC signal, and thus RF loss to a body and gate occurs.

However, according to the RF switch device of the present disclosure, the on-resistance (Ron) of the device can be improved by including an integral or integrally-formed P diode with the RF switch. That is, since the P diode is between the gate and the body of the switch, when the P diode is off and the gate or switch is on, the body appears to be open or floating (e.g., electrically disconnected), and due to this, RF loss to the body can be reduced and the on-resistance can be improved (e.g., can increase).

In addition, according to the RF switch device of the present disclosure, an insertion loss can be improved by improving the on-resistance through a reduction of RF loss. That is, since the insertion loss of an RF switch is linked to its on-resistance, by improving or increasing the on-resistance through the reduction of RF loss, the insertion loss can be improved. Alternatively, the insertion loss can be improved by utilizing a floating body effect when the RF switch is on.

Furthermore, according to the RF switch device of the present disclosure, capacitances between the source and/or drain and the body can be reduced by eliminating electrical routes (e.g., including contacts and, in some cases, wires) to the body.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the matters described in the claims. In addition, these embodiments are provided for reference in order to more completely explain the present disclosure to those skilled in the art.

Hereinafter, it should be noted that when one component (or layer) is described as being on another component (or layer), the one component may be directly on the other component, or one or more third components or layers may be between the one component and the other component. In addition, when one component is expressed as being directly on or above another component, no other component(s) are between the one component and the other component.

Moreover, being on "top", "upper", "lower", "top", "bottom" or "one (first) side" or "side" of a component refers to a relative positional relationship.

In addition, it should be noted that, where certain embodiments are otherwise feasible, certain process sequences may be performed other than as described below. For example, two processes described in succession may be performed substantially simultaneously or in the reverse order.

The term "metal oxide semiconductor" (MOS) used below is a general term, and "M" is not limited to only metal and may refer to any of various types of conductors. Also, "S" may be a substrate or a semiconductor, and "O" is not limited to oxide and may include various types of organic or inorganic dielectric materials.

Furthermore, the conductivity type of a doped region or component may be defined as "p-type" or "n-type" according to the main carrier characteristics, but this is only for convenience of description, and the technical spirit of the present disclosure is not limited to what is illustrated. For example, hereinafter, "p-type" or "n-type" may be replaced with the more general terms "first conductivity type" or "second conductivity type", and here, the first conductivity type may refer to p-type, and the second conductivity type may refer to n-type.

Furthermore, it should be understood that "high concentration" and "low concentration" with reference to the doping concentration of an impurity region refers to the relative doping concentration of one impurity region relative to other impurity regions.

Hereinafter, an RF switch device according to one or more embodiments of the present disclosure will be described in detail with reference to the accompanying drawings.

Figure 1:
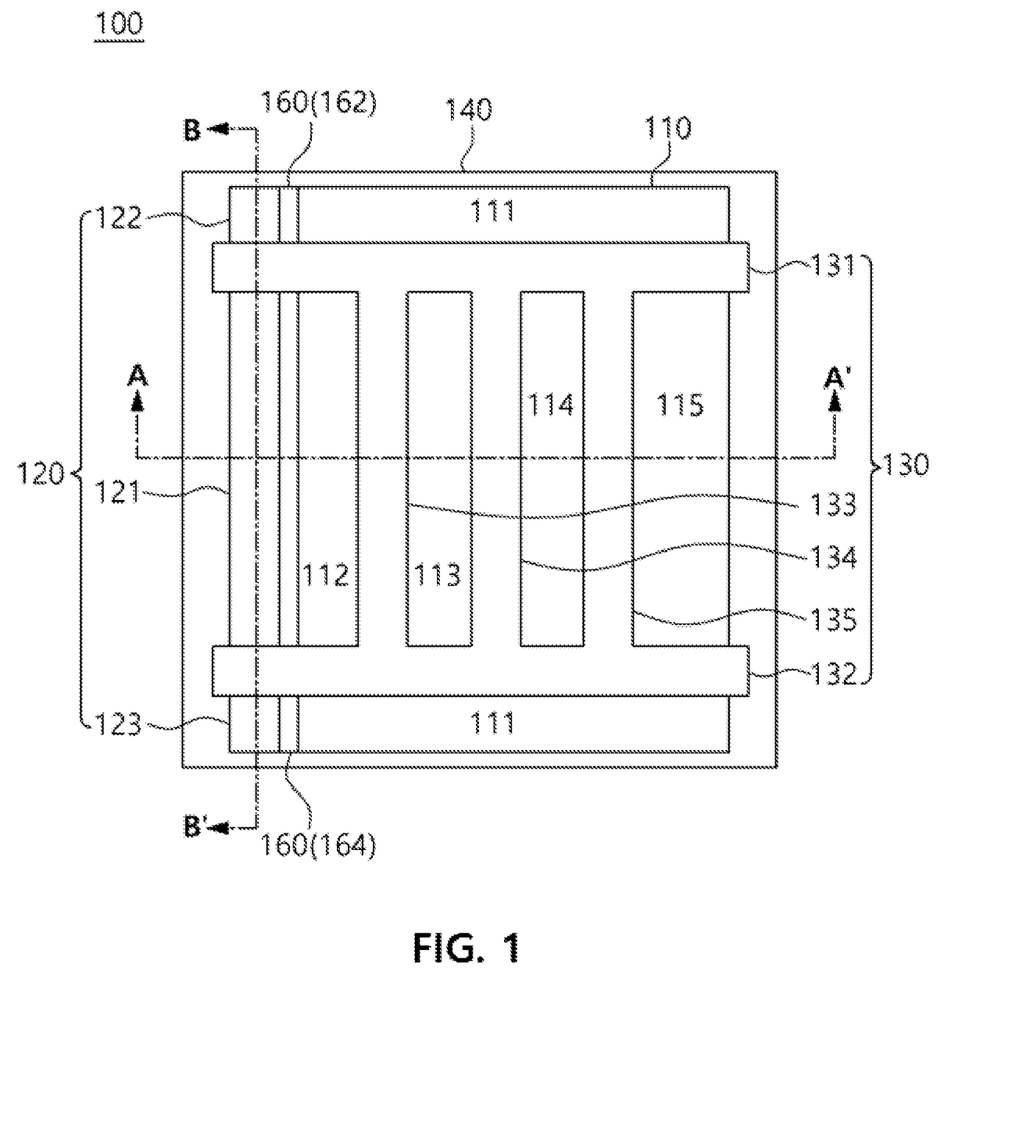
FIG. 1 is a layout or plan view showing an RF switch device according to an embodiment of the present disclosure.

Referring to FIG. 1, an RF switch device 100 according to an embodiment of the present disclosure includes a first active region 110 (e.g., a P well), a second active region 120 (e.g., an N well), and a gate electrode 130. The first active region 110 and the second active region 120 are on a base 140 (e.g., a buried oxide [BOX] layer).

The first active region 110 may comprise a P well. The first active region 110 may comprise a region or well doped with impurities having the first conductivity type in a first substrate.

The second active region 120 comprises an N well. The second active region 120 may comprise a region or well doped with impurities having the second conductivity type in the first substrate. The second active region 120 is adjacent to (e.g., on the left or right side of the first active region 110) in the drawings.

The first active region 110 and the second active region 120 may be on different substrates. That is, the first active region 110 may be on the first substrate, and the second active region 120 may be on a second substrate.

Figure 2:
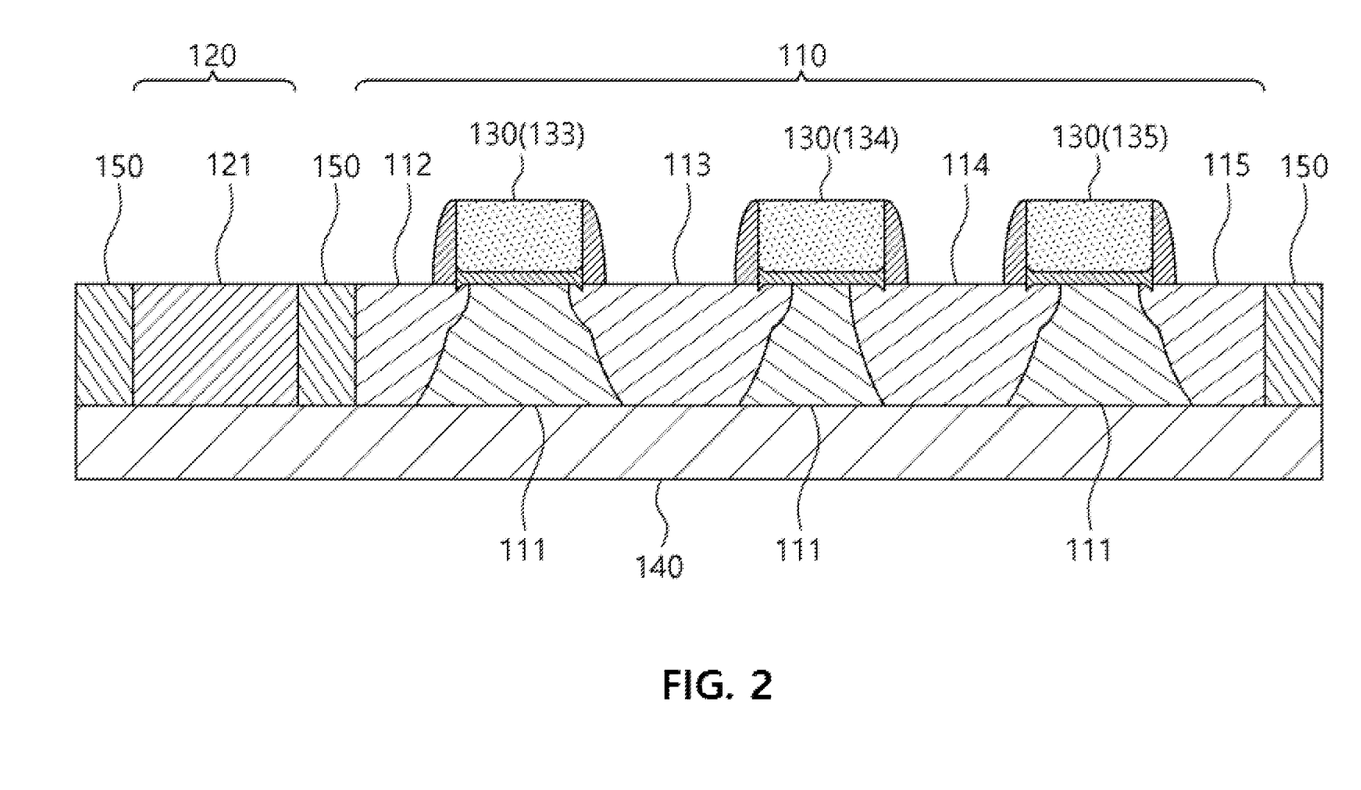
FIG. 2 is a cross-sectional view of the RF switch device of FIG. 1 taken along line A-A'.

The first active region 110 and the second active region 120 are spaced apart from each other by a separator 150 (FIG. 2). The separator 150 is along the outermost peripheral borders of the first active region 110 and the second active region 120.

Since power needs to be supplied to the RF switch in the first active region 110, the first active region 110 and the second active region 120 may be connected to each other through a conductive region 160 (FIG. 1). The conductive region 160 may include a first conductive region 162 on one side or adjacent to the gate electrode 130 (e.g., outside an outermost border or edge of the gate electrode 130) and a second conductive region 164 on an opposite side and adjacent to the gate electrode 130 (e.g., outside the outermost border or edge of the gate electrode 130 on the opposite side) in the drawing (e.g., FIG. 1).

Accordingly, part of the separator 150 may be in a location adjacent to the first active region 110, the second active region 120, the first conductive region 162, and the second conductive region 164, and may be between the first active region 110 and the second active region 120.

The gate electrode 130 is on or above the first active region 110 and the second active region 120. The gate electrode 130 includes a first horizontal electrode 131, a second horizontal electrode 132, a first cross-electrode 133, a second cross-electrode 134, and a third cross-electrode 135. An oxide layer (e.g., silicon dioxide, which may be thermally grown) may be between the gate electrode 130 and each of the first active region 110 and the second active region 120.

The first horizontal electrode 131 is an electrode having a plate-shaped or linear structure extending along a first direction (e.g., the A-A' direction), on or above the first active region 110 and the second active region 120. The first horizontal electrode 131 may be biased toward the upper part (e.g., one side) of the first active region 110 (and/or the upper part or the same side of the second active region 120) in the drawing (e.g., FIG. 1).

The second horizontal electrode 132 is an electrode having a plate-shaped or linear structure extending along the first direction and on or above the first active region 110 and the second active region 120. The second horizontal electrode 132 is spaced apart from the first horizontal electrode 131 by a predetermined distance. The second horizontal electrode 132 may be biased toward the lower parts of the first active region 110 and/or the second active region 120 (e.g., the side of the first and second active regions 110 and 120 opposite from the first horizontal electrode 131) in the drawing (e.g., FIG. 1), and is spaced apart from the first horizontal electrode 131 by a predetermined distance. In describing the first horizontal electrode 131 and the second horizontal electrode 132, the terms "upper" and "lower" may be used to refer to relative positions in the plan view of FIG. 1.

The first cross-electrode 133 is an electrode having a plate-shaped or linear structure on or over the first active region 110 and along a second direction (B-B' direction) perpendicular to the first direction. A first end of the first cross-electrode 133 is connected to the first horizontal electrode 131, and a second end of the first cross-electrode 133 is connected to the second horizontal electrode 132.

The second cross-electrode 134 is an electrode having a plate-shaped or linear structure on or over the first active region 110 and along the second direction perpendicular to the first direction. A first end of the second cross-electrode 134 is connected to the first horizontal electrode 131, and a second end of the second cross-electrode 134 is connected to the second horizontal electrode 132. The second cross-electrode 134 is spaced apart from the first cross-electrode 133 by a predetermined distance.

The third cross-electrode 135 is an electrode having a plate-shaped or linear structure on or over the first active region 110 and along the second direction perpendicular to the first direction. A first end of the third cross-electrode 135 is connected to the first horizontal electrode 131, and a second end of the third cross-electrode 135 is connected to the second horizontal electrode 132. The third cross-electrode 135 is spaced apart from the second cross-electrode 134 by a predetermined distance, and the second cross-electrode 134 may be between the first and third cross-electrodes 133 and 135.

Meanwhile, although the RF switch device 100 according to embodiment(s) of the present disclosure has been illustrated and described as including three cross-electrodes, the number of cross-electrodes may differ, and is not particularly limited to three.

The first active region 110 may be partitioned into a plurality of regions based on or defined using the gate electrode 130. For example, the first active region 110 may be partitioned into a body region 111, a first source 112, a first drain 113, a second source 114, and a second drain 115 based on or defined by the gate electrode 130.

The body region 111 is in an area of the first active region 110 adjacent to and outside the first horizontal electrode 131 and/or the second horizontal electrode 132 (e.g., opposite from the cross-electrode[s] 133, 134 and/or 135). The first source 112 is in an area of the first active region 110 between the first cross-electrode 133 and the cathode 121 or the separator 150. The first drain 113 is in an area of the first active region 110 between the first cross-electrode 133 and the second cross-electrode 134. The second source 114 is in an area of the first active region 110 between the second cross-electrode 134 and the third cross-electrode 135. The second drain 115 is in an area of the first active region 110 adjacent to and outside of the third cross-electrode 135, between the first and second horizontal electrodes 131 and 132.

Referring to FIG. 2, the first source 112 is between the first cross-electrode 133 and the separator 150, and may be formed by implanting a second conductivity type impurity (e.g., phosphorus [P] or arsenic [As], etc.) into the first active region 110 (e.g., P well) using the gate electrode 130 and/or a patterned photoresist as a mask.

The first drain 113 may be formed by implanting the second conductivity type impurity into in the first active region 110 (e.g., P well) using the first cross-electrode 133, the second cross-electrode 134, the first horizontal electrode 131, the second horizontal electrode 132 and/or the patterned photoresist as a mask. The first drain 113 may be formed at the same time or in the same process as the first source 112.

The second source 114 is formed by implanting the second conductivity type impurity into in the first active region 110 (e.g., P well) using the second cross-electrode 134, the third cross-electrode 135, the first horizontal electrode 131, the second horizontal electrode 132 and/or the patterned photoresist as a mask. The second source 114 may be formed at the same time or in the same process as the first source 112 and the first drain 113.

The second drain 115 is formed by implanting the second conductivity type impurity into the first active region 110 (e.g., P well) using the third cross-electrode 135, the first horizontal electrode 131 and the second horizontal electrode 132 and/or the patterned photoresist as a mask. The second drain 115 may be formed at the same time or in the same process as the first source 112, the first drain 113 and the second source 114.

The second active region 120 may be partitioned into a plurality of regions or structures based on or defined using the gate electrode 130. For example, the second active region 120 may be partitioned into a cathode 121, a first anode 122, and a second anode 123.

Based on the plan view of FIG. 1, the cathode 121 is between the first horizontal electrode 131 and the second horizontal electrode 132 in the second active region 120. Based on the plan view of FIG. 1, the first anode 122 is adjacent to and outside the first horizontal electrode 131 in the second active region 120. Based on the plan view of FIG. 1, the second anode 123 is adjacent to and outside the second horizontal electrode 132 in the second active region 120. For example, the anodes 122 and 123 are on respective sides of the first and second horizontal electrodes 131 and 132 opposite from the cathode 121.

Figure 3:
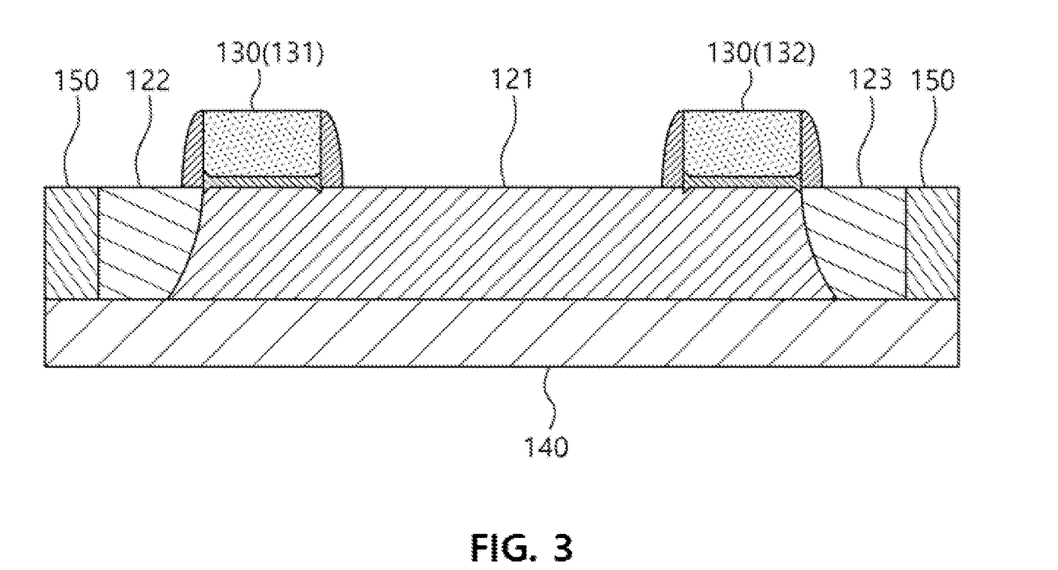
FIG. 3 is a cross-sectional view of the RF switch device of FIG. 1 taken along line B-B'.

Referring to FIG. 3, the first anode 122 may be formed by implanting a first conductivity type impurity (e.g., boron [B], etc.) in the second active region 120 (e.g., N well) using the first horizontal electrode 131 and/or a patterned photoresist as a mask. The second anode 123 is formed by implanting the first conductivity type impurity (e.g., boron [B], etc.) in the second active region 120 (e.g., N well) using the second horizontal electrode 132 and/or the patterned photoresist as a mask. The second anode 123 may be formed at the same time or in the same process as the first anode 122.

According to the above-described structure, the RF switch device 100 according to embodiment(s) of the present disclosure has a structure including an RF switch (i.e., the first active region 110) and an integral or integrally-formed P diode (i.e., the second active region 120). That is, the RF switch device 100 includes the RF switch comprising the first active region 110 and the gate electrode 130, and the P diode comprising the second active region 120 and the gate electrode 130.

In the case of a typical RF switch, the RF signal that passes from a drain or source to the other during operation is an AC signal, rather than a DC signal, and thus RF loss to a body and gate of the RF switch occurs.

However, in the RF switch device 100 according to embodiment(s) of the present disclosure, since a P diode is between the gate electrode 130 and the body region 111, the P diode is turned off while the gate 130 of the RF switch is on, and the body region 111 appears to be open or floating. Due to this, RF loss to the body region 111 is effectively eliminated.

In addition, in the RF switch device 100 according to embodiment(s) of the present disclosure, by eliminating RF loss, the on-resistance (Ron) is improved compared to typical RF switches.

Moreover, in the RF switch device 100 according to embodiment(s) of the present disclosure, since the on-resistance (Ron) is improved, insertion loss linked to the on-resistance, which is one of the characteristics of the RF switch, also improves.

Figure 4:
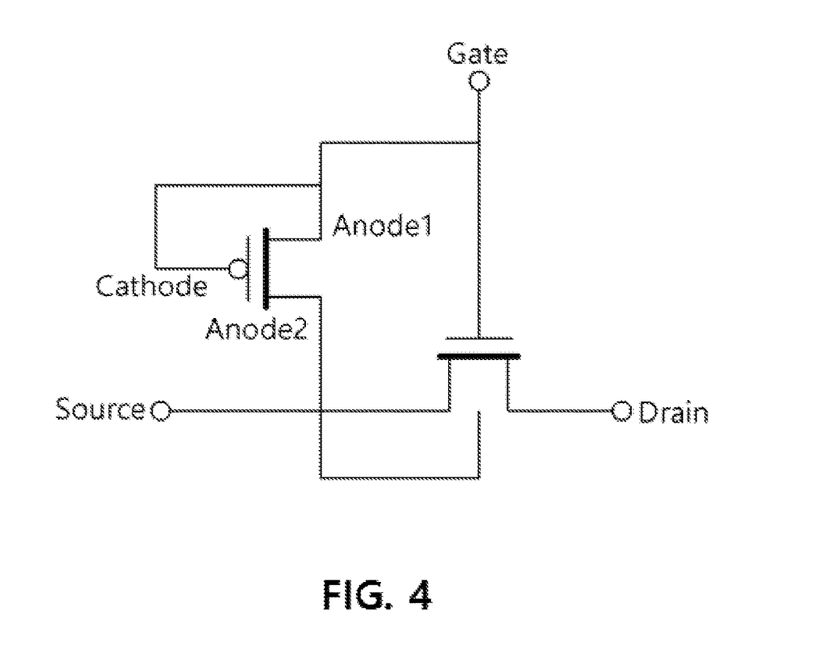
FIG. 4 is a circuit diagram schematically representing an RF switch device according to an embodiment of the present disclosure.
Figure 5:
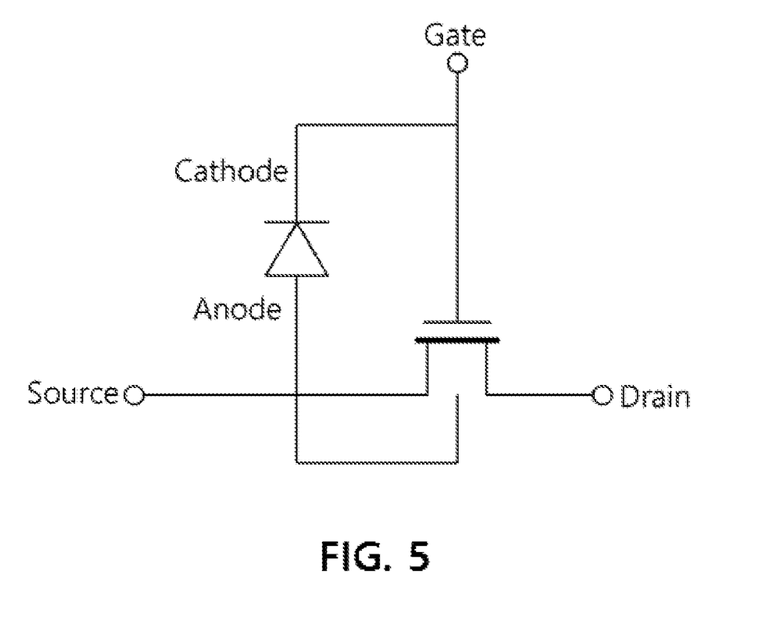
FIG. 5 is a circuit diagram representing an RF switch device equivalent to that of FIG. 4 according to an embodiment of the present disclosure.

The RF switch device 100 according to embodiment(s) of the present disclosure may be expressed schematically as the circuit shown in FIG. 4, and equivalently as the circuit shown in FIG. 5.

When +Vdd is applied to the gate electrode 130, the P diode is turned off and the body region 111 of the switch becomes open or floating, and thus, no voltage is supplied or provided (e.g., to the body region 111). When −Vdd is applied to the gate electrode 130, the P diode is turned on and a first voltage (that is, −Vdd, a voltage that may be equal or equivalent to a reference voltage of the diode) is supplied to the body region 111 of the switch. Thus, in the RF switch device 100 according to embodiment(s) of the present disclosure, the body bias may be controlled only with the gate bias.

In addition, in the RF switch device 100 according to embodiment(s) of the present disclosure, controlling the body bias with the gate bias eliminates any need for a separate voltage to the body of the switch. As a result, electrical routes to the body (e.g., contacts and/or wires) may also be eliminated.

Furthermore, in the RF switch device 100 according to embodiment(s) of the present disclosure, by removing the electrical routes to the body, capacitances (e.g., actual or parasitic) between the source and/or drain and the body may be reduced.

The above detailed description is illustrative of the present disclosure. In addition, the above description shows and describes various embodiments of the present disclosure, and the present disclosure can be used in various other combinations, modifications, and environments. That is, changes or modifications are possible within the scope of the concepts disclosed herein, the scope equivalent to the written disclosure, and/or within the scope of skill or knowledge in the art. The above-described embodiments describe various ways for implementing the technical ideas of the present disclosure, and various changes for specific applications or fields of use are possible. Accordingly, the detailed description of the present disclosure is not intended to limit the present disclosure to the disclosed embodiments.

What is claimed is:

1. An RF switch device, comprising:
   a first active region comprising a P well on or in a substrate;
   a P diode comprising (i) an N well cathode on or in the substrate and (ii) a first p-type anode and a second p-type anode on opposite sides of the cathode;
   a gate electrode on the first active region and the P diode; and
   a first conductive region connecting at least a portion of the P well body region and one of the first p-type anode and the second p-type anode,
   wherein the gate electrode comprises:
      first and second horizontal electrodes spaced apart from each other; and
      a plurality of cross-electrodes connecting the first and second horizontal electrodes, and
   the first active region comprises:
      a source on a first side of each of the cross-electrodes; and
      a drain on a second side of each of the cross-electrodes.

2. The RF switch device of claim 1, wherein:
   the first horizontal electrode is on the first active region and the second active region along a first direction;
   the second horizontal electrode is spaced apart from the first horizontal electrode and on the first active region and the second active region along the first direction; and
   the plurality of cross-electrodes are on the first active region along a second direction perpendicular to the first direction, and each of the plurality of cross-electrodes has ends respectively connected to the first horizontal electrode and the second horizontal electrode.

3. The RF switch device of claim 2, wherein the one or more cross-electrodes comprise:
   a first cross-electrode on the first active region along the second direction;
   a second cross-electrode spaced apart from the first cross-electrode, on the first active region along the second direction; and
   a third cross-electrode spaced apart from the second cross-electrode, on the first active region along the second direction,
   wherein the second cross-electrode is between the first cross-electrode and the third cross-electrode.

4. The RF switch device of claim 3, wherein:
   the cathode is between the first horizontal electrode and the second horizontal electrode;

the first anode is on a side of the first horizontal electrode opposite from the cathode; and
the second anode is on a side of the second horizontal electrode opposite from the cathode.

5. The RF switch device of claim 1, wherein:
   the first conductive region is adjacent to one of the first and second horizontal electrodes; and
   the RF switch device further comprises a second conductive region adjacent to a remaining one of the first and second horizontal electrodes, connecting the first active region and the other one of the first p-type anode and the second p-type anode.

6. The RF switch device of claim 1, further comprising:
   a separator electrically separating the first active region and the P diode, and.

7. The RF switch device of claim 1, wherein the first anode and the second anode comprise p-type impurity-doped regions.

8. The RF switch device of claim 1, wherein:
   the P well comprises a body region under each of the horizontal electrodes in the first active region.

9. The RF switch device of claim 1, further comprising a buried oxide layer under the first active region and the N well cathode.

10. The RF switch device of claim 9, wherein the plurality of source and drain terminals comprise:
    a first source on a first side of the first cross-electrode;
    a first drain between the first cross-electrode and the second cross-electrode;
    a second source between the second cross-electrode and the third cross-electrode; and
    a second drain on a remaining side of the third cross-electrode.

11. An RF switch device, comprising:
    a first active region comprising a P well body region on or in a substrate and a plurality of source and drain terminals spaced apart from each other;
    a second active region comprising a N well cathode on or in the substrate and first and second p-type anodes on opposite sides of the cathode; and
    a gate electrode on the first active region and the second active region; and
    a first conductive region connecting at least a portion of the P well and one of the first and second p-type anodes,
    wherein the gate electrode comprises:
       first and second horizontal electrodes spaced apart from each other; and
       a plurality of cross-electrodes connecting the first and second horizontal electrodes.

12. The RF switch device of claim 11, wherein:
    the first conductive region is adjacent to the first horizontal electrode; and
    the RF switch device further comprises a second conductive region adjacent to the second horizontal electrode, configured to connect the first active region and the other one of the first and second p-type anodes.

13. The RF switch device of claim 11, wherein,
    in the first active region, one of the cross-electrodes is between a first one of the source and drain terminals and a second one of the source and drain terminals.

14. The RF switch device of claim 11, further comprising a separator separating the first active region and the second active region.

15. The RF switch device of claim 11, wherein the first anode and the second anode comprise p-type impurity-doped regions.

16. The RF switch device of claim 11, wherein the one or more cross-electrodes comprise:
   a first cross-electrode on the first active region;
   a second cross-electrode spaced apart from the first cross-electrode, on the first active region; and
   a third cross-electrode spaced apart from the second cross-electrode, on the first active region,
   wherein the second cross-electrode is between the first cross-electrode and the third cross-electrode.

17. The RF switch device of claim 11, further comprising a buried oxide layer under the first active region and the N well cathode.

\* \* \* \* \*